(12) United States Patent
Nozawa

(10) Patent No.: US 12,389,579 B2
(45) Date of Patent: Aug. 12, 2025

(54) COMPONENT SUPPLY DEVICE

(71) Applicant: FUJI CORPORATION, Chiryu (JP)

(72) Inventor: Mizuho Nozawa, Kota-cho (JP)

(73) Assignee: FUJI CORPORATION, Chiryu (JP)

( * ) Notice: Subject to any disclaimer, the term of this patent is extended or adjusted under 35 U.S.C. 154(b) by 216 days.

(21) Appl. No.: 18/303,853

(22) Filed: Apr. 20, 2023

(65) Prior Publication Data
US 2023/0345688 A1    Oct. 26, 2023

(30) Foreign Application Priority Data

Apr. 22, 2022  (JP) ................... 2022-070838

(51) Int. Cl.
*H05K 13/02* (2006.01)
*B65G 1/04* (2006.01)

(52) U.S. Cl.
CPC ............. *H05K 13/02* (2013.01); *B65G 1/04* (2013.01)

(58) Field of Classification Search
CPC . B65G 1/07; B65G 1/16; B65G 37/00; H05K 13/0434; H05K 13/086; H05K 13/085; H05K 13/02; H05K 13/021
See application file for complete search history.

(56) References Cited

U.S. PATENT DOCUMENTS

| | | | | |
|---|---|---|---|---|
| 5,203,661 A * | 4/1993 | Tanita | ................ | H05K 13/021 414/280 |
| 11,251,064 B2 * | 2/2022 | Kuo | ................ | H01L 21/67294 |
| 2013/0309049 A1 * | 11/2013 | Yamagata | ............ | H05K 13/021 414/222.01 |
| 2015/0245497 A1 * | 8/2015 | Iwata | ................ | H05K 13/0434 29/832 |
| 2017/0260032 A1 * | 9/2017 | Kadota | ................ | H05K 13/021 |

FOREIGN PATENT DOCUMENTS

| | | | |
|---|---|---|---|
| JP | 3182985 B2 | 7/2001 | |
| JP | 6730219 B2 | 7/2020 | |
| JP | 7008129 B2 | 1/2022 | |

* cited by examiner

*Primary Examiner* — Glenn F Myers
(74) *Attorney, Agent, or Firm* — Oblon, McClelland, Maier & Neustadt, L.L.P.

(57) ABSTRACT

Provided is a component supply device that further reduces the burden on an operator as compared with the conventional art. The component supply device includes: a magazine unit provided with a magazine accommodating multiple pallets each of which holds multiple components; a pallet pulling-out mechanism configured to selectively pull out the pallet from the magazine and transfer the pallet to a component supply position of a component mounter; a storage configured to store a larger number of the multiple pallets than the magazine unit; and a replacement mechanism configured to replace the pallet between the magazine and the storage.

18 Claims, 8 Drawing Sheets

COMPONENT SUPPLY DEVICE

TECHNICAL FIELD

The present specification relates to a component supply device using a pallet holding multiple components.

BACKGROUND ART

A technique for mass-producing a board product by performing a board work on a board on which a circuit pattern is formed has become widespread. A typical example of a board work machine that performs the board work is a component mounter that performs a mounting work of components. Examples of a component supply device provided in the component mounter include a type in which a pallet holding a tray that accommodates respective components in multiple holding compartments is used, and a type in which a carrier tape that accommodates respective components in multiple cavities is used. Technical examples related to the component supply device using a pallet are disclosed in Patent Literature 1 to 3.

A component supply device of Patent Literature 1 includes a pallet accommodation section configured to accommodate multiple pallets, a pallet placement section configured to place the pallet in a supply place of a component mounter, a first pallet movement section configured to move the pallet between the pallet accommodation section and the pallet placement section, a pallet replenishment and collection section configured to perform replenishment and collection of the pallet, and a second pallet movement section configured to move the pallet between the pallet accommodation section and the pallet replenishment and collection section. The pallet replenishment and collection section is disposed on a near side of the pallet accommodation section, and is configured to allow an operator to place a pallet scheduled to be used and to take out a used pallet.

A component supply device of Patent Literature 2 includes a magazine configured to hold multiple pallets, a magazine holding section configured to convey the pallet from the held magazine to a component supply position, a magazine supply section configured to supply the magazine to the magazine holding section, and a magazine discharging section configured to receive the magazine discharged from the magazine holding section. According to this, the magazine holding the multiple pallets is conveyed to automatically perform component replenishment so that it is possible to suppress the workload of the component replenishment on the operator.

A chip supply device of Patent Literature 3 includes a magazine configured to slidably store trays for chip storage in a horizontal direction by stacking the trays, a first pulling-out unit configured to pull out the tray stored in the magazine downward of a pickup head, a holder configured to suspend and hold the magazine, and an up-down moving means configured to move the holder up and down, and exchanges the magazine. According to this, exchanging magazine becomes light work and can be smoothly performed.

PATENT LITERATURE

Patent Literature 1: Japanese Patent No. 6730219
Patent Literature 2: Japanese Patent No. 7008129
Patent Literature 3: Japanese Patent No. 3182985

BRIEF SUMMARY

Technical Problem

Meanwhile, in the component supply device of Patent Literature 1, since the operator performs replenishment and collection of the pallets one by one, the movement to the component supply device tends to be frequent. On the other hand, in the component supply device of Patent Literature 2 and the chip supply device of Patent Literature 3, it is possible to exchange the magazine holding the multiple pallets. With this, since the operator can replace the multiple pallets with one setup replacement work, the work efficiency is improved and the number of movements to the component supply device is reduced.

However, it cannot be said that the number of works is sufficiently reduced even in the setup replacement work on a magazine basis, and the labor required for the work and the time required for the movement are burdensome for the operator. In particular, when a magazine is assigned for each type of board in order to respond to multi-type and small-quantity production that has been increasing in recent years, the burden on the operator is increased because the setup replacement work on a magazine basis is frequently performed even in a case where the pallet in the magazine is in use.

Therefore, an object to be achieved of the present specification is to provide a component supply device that further reduces the burden on an operator as compared with the conventional art.

Solution to Problem

The present specification discloses a component supply device including: a magazine unit provided with a magazine accommodating multiple pallets each of which holds multiple components; a pallet pulling-out mechanism configured to selectively pull out the pallet from the magazine and transfer the pallet to a component supply position of a component mounter; a storage configured to store a larger number of the multiple pallets than the magazine unit; and a replacement mechanism configured to replace the pallet between the magazine and the storage.

Advantageous Effects

With the component supply device disclosed in the present specification, the replacement mechanism replaces the pallet between the magazine and the storage in a case of exchanging the pallet provided in the magazine. Here, the storage can store a larger number of pallets than the magazine unit, and the setup replacement work of the pallets is not necessary before all the stored pallets are used. Therefore, the setup replacement work of replacing the pallet in the storage with another pallet is performed less frequently as compared with the conventional setup replacement work of exchanging the magazine. That is, the operator can perform the setup replacement work of exchanging a larger number of pallets at a time than in the conventional art at a lower frequency than in the conventional art. As a result, the burden on the operator is further reduced as compared with the conventional art.

DESCRIPTION OF EMBODIMENTS

1. Configuration of Component Supply Device 1 of First Embodiment

Figure 1:
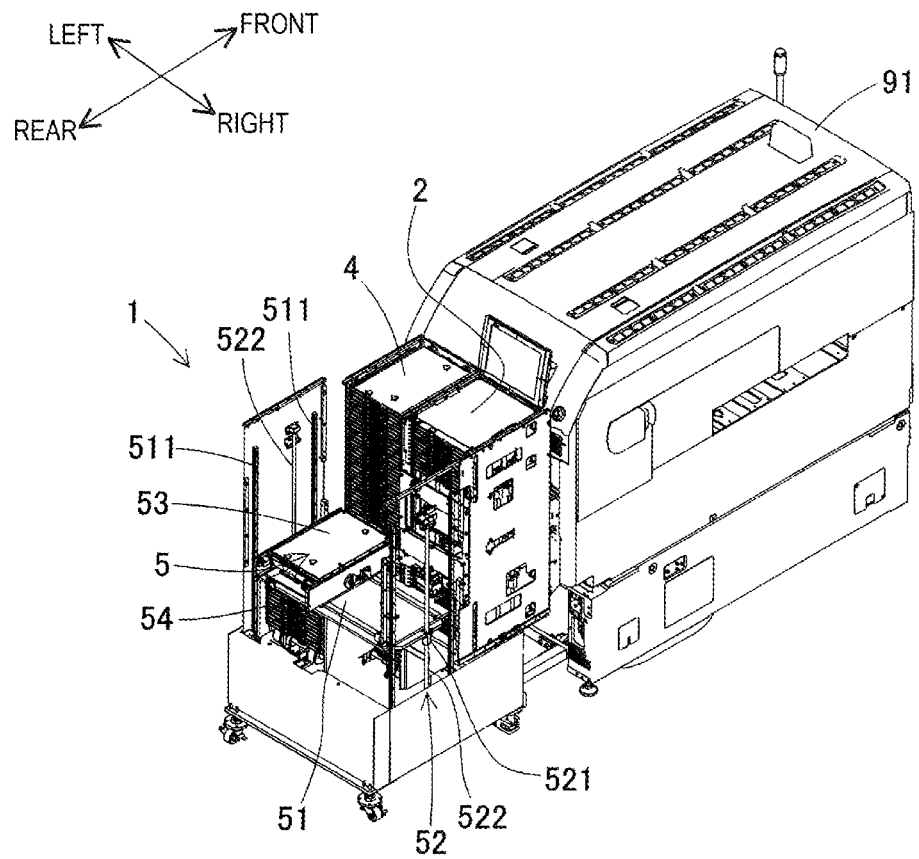
FIG. 1 is a perspective view showing a configuration in which an exterior case of a component supply device of a first embodiment is omitted, and shows a state in which the component supply device is installed on a component mounter.
Figure 2:
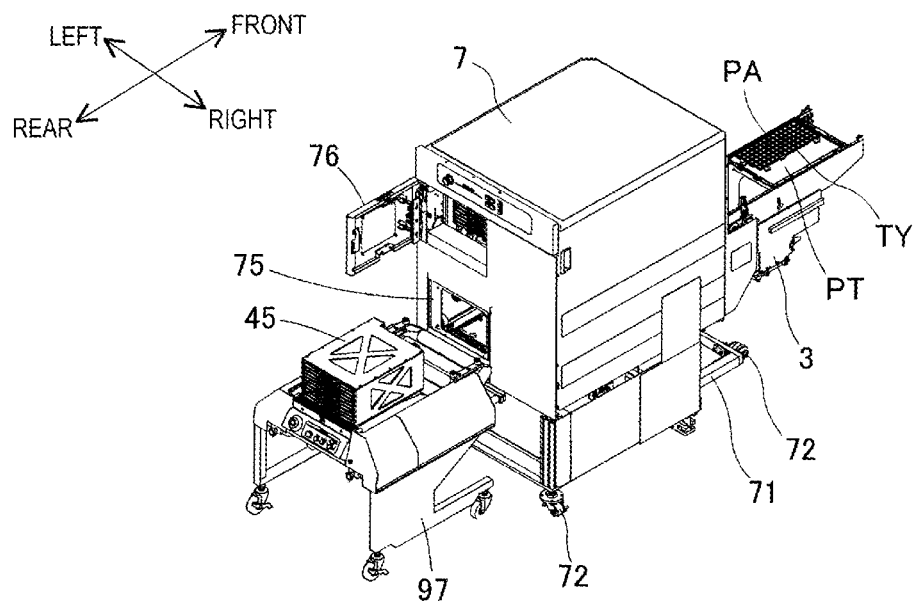
FIG. 2 is a perspective view showing a configuration of the component supply device and shows a state in which an unmanned conveyance vehicle has arrived.
Figure 3:
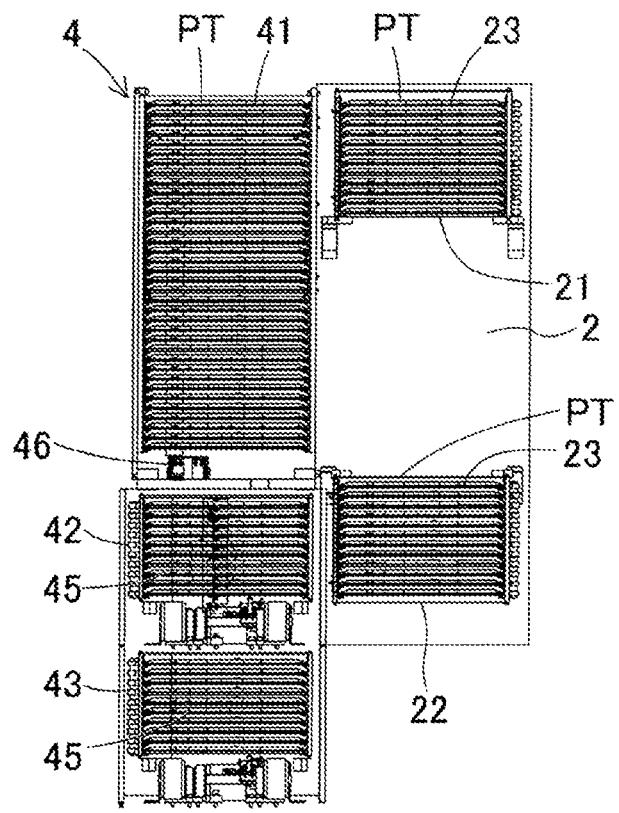
FIG. 3 is a view showing a magazine unit and a storage as viewed from behind.
Figure 4:
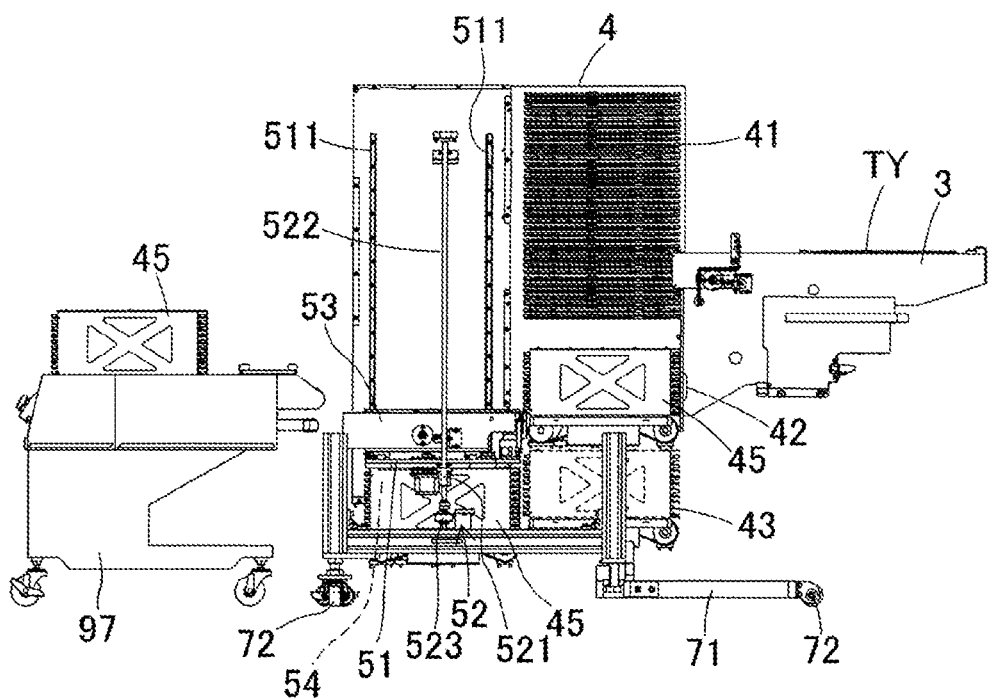
FIG. 4 is a view showing a pallet pulling-out mechanism, the storage, and a replacement mechanism as viewed from a right direction and shows a state in which the unmanned conveyance vehicle has arrived.

The configuration of component supply device 1 of the first embodiment will be described with reference to FIGS. 1 to 5. As indicated by arrows in an upper left part of FIGS. 1 and 2, front-rear and left-right directions of component supply device 1 and component mounter 91 are defined. According to this definition, the left-right direction corresponds to a board conveyance direction in which component mounter 91 conveys a board. In addition, the direction from the rear to the front corresponds to a direction in which pallet pulling-out mechanism 3, which will be described later, pulls out pallet PT from magazine unit 2. In FIGS. 1, 3, and 4, exterior case 7 is not shown.

Component mounter 91 shown in FIG. 1 includes a board conveyance device that conveys a board and a component transfer device that picks up and mounts component PA onto the board, and component supply device 1 is detachably installed thereon. Component mounter 91 repeats a component mounting work of picking up component PA at component supply position 92 (see FIG. 7) using a component mounting tool of the component transfer device, and of mounting component PA onto a mounting position set on a board.

Component supply device 1 is used by being installed on a rear side of component mounter 91. Component supply device 1 performs a component supply work of supplying component PA to component supply position 92 of component mounter 91 using pallet PT holding multiple components PA. Component supply device 1 includes magazine unit 2, pallet pulling-out mechanism 3, storage 4, replacement mechanism 5, control section 6 (see FIG. 6), exterior case 7, and the like.

Magazine unit 2 is disposed on a front right side of an internal space of exterior case 7 having a substantially rectangular parallelepiped shape. Magazine unit 2 has a housing shape of a vertically long substantially rectangular parallelepiped in which a front side and a rear side are open, and has a width dimension larger than a width dimension of pallet PT. As shown in FIG. 3, upper magazine 21 is provided inside magazine unit 2, and lower magazine 22 is provided below upper magazine 21. Upper magazine 21 and lower magazine 22 have a substantially rectangular parallelepiped shape and have substantially the same shape as each other. Upper magazine 21 and lower magazine 22 can be lifted and lowered along a common guide rail (not shown) extending in the up-down direction, and can be lifted and lowered relative to pallet pulling-out mechanism 3. A single magazine may be provided inside magazine unit 2.

Each of upper magazine 21 and lower magazine 22 has multiple slots 23 arranged in the up-down direction. Slot 23 is defined and formed by using a thin plate material bridged horizontally or a pair of thin plate materials disposed separately in the left and right and extending in the front-rear direction. Each of slots 23 accommodates pallet PT such that pallet PT can be taken out or put in from both the front and rear directions. Each of pallets PT holds multiple components PA on an upper surface thereof.

Figure 5:
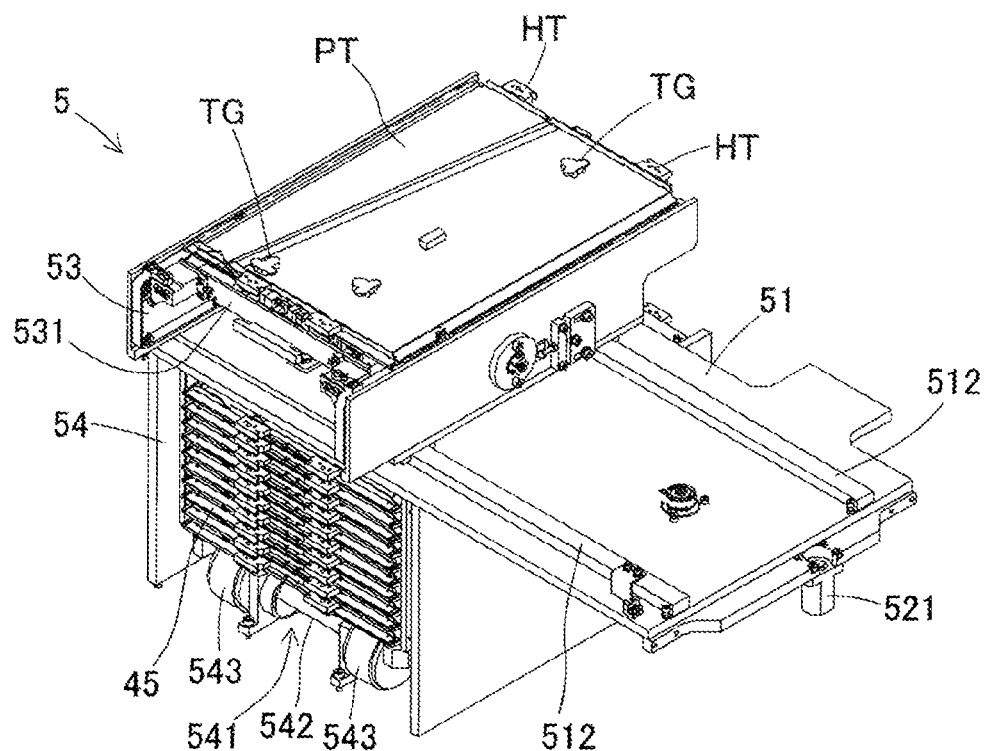
FIG. 5 is a perspective view of the replacement mechanism.

In the first embodiment, pallet PT has a structure for detachably attaching tray TY that holds components PA in multiple holding compartments arranged in a lattice form. The configuration is not limited to this, and a structure in which pallet PT itself has multiple holding compartments may be used. In FIG. 5, tray TY is not shown. Pallet PT has attaching tool TG for attaching tray TY to the upper surface thereof. In addition, operation protrusions HT for a taking-out/putting-in operation or a replacement operation are provided at two locations spaced apart from each other in the left-right direction on each of a front edge and a rear edge of pallet PT.

Further, pallet PT is attached with an identification tag indicating a pallet number specifying pallet PT. In the first embodiment, an RFID tag that transmits the pallet number with a wireless signal is incorporated in pallet PT as the identification tag. The configuration is not limited to this, and the identification tag may be things that display a barcode or a two-dimensional code that can be read by various tag readers, or display a character string.

Magazine lifting and lowering mechanism 24 (see FIG. 6) is provided inside magazine unit 2. Magazine lifting and lowering mechanism 24 lifts and lowers upper magazine 21 and lower magazine 22 independently of each other. In addition, magazine lifting and lowering mechanism 24 is controlled so as to avoid collision between upper magazine 21 and lower magazine 22. With this, magazine lifting and lowering mechanism 24 adjusts heights of multiple pallets PT to align the height of pallet PT, which is a pulling-out operation target, with the pulling-out height of pallet pulling-out mechanism 3. As magazine lifting and lowering mechanism 24, a ball screw feeding mechanism or a linear motor mechanism can be used. The height of pallet PT, which is the pulling-out operation target, may be aligned with the pulling-out height of pallet pulling-out mechanism 3 by fixing magazines (21, 22) provided in magazine unit 2 and lifting and lowering pallet pulling-out mechanism 3.

Pallet pulling-out mechanism 3 is disposed on the front side of magazine unit 2. In a state in which component supply device 1 is installed on component mounter 91, pallet pulling-out mechanism 3 enters the inside of component mounter 91 (see FIG. 7). Pallet pulling-out mechanism 3 selectively pulls out pallet PT forward from any one of magazines (21, 22), and transfers pallet PT to component supply position 92 (see FIG. 7) of component mounter 91. The component mounting tool picks up component PA, and then pallet pulling-out mechanism 3 returns pallet PT to original slot 23 of original magazine (21, 22).

Storage 4 is disposed on a front left side of the internal space of exterior case 7, in other words, on a left side of magazine unit 2. Therefore, magazine unit 2 and storage 4 are disposed side by side in the board conveyance direction on the rear side of component mounter 91. The dispositions of magazine unit 2 and storage 4 may be replaced with each other. Storage 4 has a housing shape of a vertically long substantially rectangular parallelepiped in which a rear side is open, and has a width dimension larger than the width dimension of pallet PT. Storage 4 has multiple pallet storage shelves 41 arranged in the up-down direction from a substantially intermediate height to an upper part. Each of pallet storage shelves 41 stores pallet PT such that pallet PT can be taken out or put in from behind. The number of pallet storage shelves 41 is larger than the sum of slots 23 of two magazines (21, 22). Therefore, storage 4 can store a larger number of pallets PT than magazine unit 2.

In addition, storage 4 has upper magazine storage shelf 42 and lower magazine storage shelf 43 that are vertically arranged from a substantially intermediate height to a lower part. Each of two magazine storage shelves (42, 43) stores conveyance magazine 45 such that conveyance magazine 45 can be taken out or put in from behind. Two magazine storage shelves (42, 43) have different uses from each other. That is, upper magazine storage shelf 42 is used as a carry-in shelf for storing conveyance magazine 45 carried into component supply device 1. Lower magazine storage shelf 43 is used as a carry-out shelf for storing conveyance magazine 45 to be carried out from component supply device 1.

Upper magazine storage shelf 42 and lower magazine storage shelf 43 are not limited to the carry-in shelf and the carry-out shelf, respectively, and upper magazine storage shelf 42 may be used as the carry-out shelf and lower magazine storage shelf 43 may be used as the carry-in shelf. Alternatively, upper magazine storage shelf 42 and lower magazine storage shelf 43 may be switched between the carry-in shelf and the carry-out shelf depending on the disposition situation of pallets PT in storage 4. Alternatively, one magazine storage shelf may be provided in storage 4. Alternatively, upper magazine storage shelf 42 and lower magazine storage shelf 43 may be separated from storage 4.

Conveyance magazine 45 is a conveyance device capable of accommodating and carrying multiple pallets PT. Conveyance magazine 45 has a substantially rectangular parallelepiped shape as in magazines (21, 22) described above, and accommodates pallet PT in each of multiple slots arranged in the up-down direction. The use of conveyance magazine 45 facilitates a replenishment work of multiple pallets PT. Conveyance magazine 45 is set up by setting pallets PT that are scheduled to be used, in external setup area 95 (see FIG. 6). Alternatively, conveyance magazine 45 may be stored in component warehouse 96 (see FIG. 6) provided outside component supply device 1. Component warehouse 96 is a warehouse for storing components (trays TY), and can store the components (trays TY) together with pallets PT and conveyance magazine 45.

A conveyance work of conveying conveyance magazine 45 between three locations, that is, component supply device 1, external setup area 95, and component warehouse 96, is performed by unmanned conveyance vehicle 97. Unmanned conveyance vehicle 97 loads one or multiple conveyance magazines 45, automatically travels, and arrives at a position immediately behind storage 4 of component supply device 1. With this, the replenishment work of multiple pallets PT is automated. The configuration is not limited to this, and conveyance magazine 45 may be carried by the operator for the conveyance.

Conveyance magazine 45 differs from magazine (21, 22) in at least one of an accommodation structure for accommodating multiple pallets PT and the number of accommodations. Therefore, the conventional technique of replacing conveyance magazine 45 and magazine (21, 22) with each other is not applied. The difference will be described in detail as an example. Conveyance magazine 45 has a structure in which pallet PT is taken out or put in from behind, whereas magazines (21, 22) have a structure in which pallet PT can be taken out or put in from both the front and rear directions.

In addition, the number of pallets accommodated in conveyance magazine 45 is designed in consideration of the frequency of replenishment requests for pallets PT in component mounter 91. The number of pallets accommodated in conveyance magazine 45 is further subject to constraints such as the loading weight and the conveyance frequency of unmanned conveyance vehicle 97, and constraints such as the height dimension of storage 4. For example, in a case where the number of component types to be mounted by component mounter 91 is small or the cycle time is long, or in a case where the frequency of setup replacement is low, the frequency of requesting the replenishment of pallet PT is relatively low. Therefore, the number of pallets accommodated in conveyance magazine 45 may be smaller than the number of pallets accommodated in magazine (21, 22). On the other hand, in a case where the number of component types to be mounted by component mounter 91 is large or the cycle time is short and the exchange frequency of the pallet is high, or in a case where the frequency of setup replacement is high and the component types are frequently changed, the frequency of requesting the replenishment of pallet PT is high. Therefore, the number of pallets accommodated in conveyance magazine 45 is made larger than the number of pallets accommodated in magazine (21, 22) so long as the constraints of unmanned conveyance vehicle 97 and storage 4 permit. With this, it is possible to suppress a replenishment delay of pallet PT.

Returning to the description of storage 4, RFID reader 46 is provided on upper magazine storage shelf 42 used as the carry-in shelf (see FIG. 3). RFID reader 46 receives a wireless signal transmitted from the RFID tag of each pallet PT in conveyance magazine 45 stored in upper magazine storage shelf 42, and recognizes the pallet number. With this, for each pallet PT in conveyance magazine 45, the pallet number and the slot position in conveyance magazine 45 can be associated with each other. The position at which RFID reader 46 is provided is appropriately changed depending on modification examples of the carry-in shelf described above.

In a case where a first of upper magazine storage shelf 42 and lower magazine storage shelf 43 is used as the carry-in shelf and a second is used as the carry-out shelf in a fixed manner, only one RFID reader 46 may be installed in the carry-in shelf, which is economical. In addition, in a case where the use classifications of the carry-in shelf and the carry-out shelf are not defined, responses can be made depending on situations by providing RFID reader 46 for each of two magazine storage shelves (42, 43), but the device cost is increased. In addition, RFID reader 46 has an advantage of being compact as compared with other types of tag readers and having fewer constraints on the installation position and the installation posture. Therefore, component supply device 1 is not increased in size even in a case where RFID reader 46 is provided.

RFID reader 46 may be provided at another portion. For example, a configuration can be employed in which RFID reader 46 is provided in pallet operation section 53, which will be described later, to receive a wireless signal transmitted from the RFID tag of pallet PT being operated. In addition, in a case where an identification tag other than the RFID tag is used as the identification tag, a tag reader capable of reading the identification tag is provided in storage 4 or replacement mechanism 5.

Replacement mechanism 5 is disposed at the rear part of the internal space of exterior case 7. In other words, replacement mechanism 5 is commonly disposed on the rear sides of magazine unit 2 and storage 4 such that pallet PT can be pulled out rearward from magazine unit 2. Replacement mechanism 5 replaces pallet PT between magazine (21, 22) and storage 4. Further, replacement mechanism 5 replaces pallet PT between conveyance magazine 45 stored in upper magazine storage shelf 42 and at least one of storage 4 and magazine (21, 22). As shown in FIGS. 1 and 5, replacement mechanism 5 includes lifting and lowering table 51, lifting and lowering drive mechanism 52, pallet operation section 53, magazine operation section 54, and the like.

Lifting and lowering table 51 is a substantially rectangular plate-shaped member disposed horizontally. The width dimension of lifting and lowering table 51 in the left-right direction has a length sufficient for pallet operation section 53, which will be described later, to horizontally move on lifting and lowering table 51 and to perform a pallet replacement operation between magazine unit 2 and storage 4 arranged in the left and right. Lifting and lowering table 51 is installed so as to be capable of being lifted and lowered on four lifting and lowering rails 511 extending in the up-down direction along the left and right inner surfaces of exterior case 7. A front-rear pair of guide rails 512 extending in the left-right direction are provided on an upper surface of lifting and lowering table 51.

Lifting and lowering drive mechanism 52 drives lifting and lowering table 51 to perform a lifting and lowering operation. In the first embodiment, lifting and lowering drive mechanism 52 is a left-right pair of ball screw feeding mechanisms disposed on the inner surfaces of exterior case 7. Specifically, ball nut 521 is provided at each of a right edge and a left edge of lifting and lowering table 51 in a posture having a center line in a vertical direction. Meanwhile, ball screws 522 are rotatably supported on the inner surfaces of exterior case 7 while extending in the vertical direction. Ball screw 522 is screw-coupled to ball nut 521 via a ball for friction reduction. Drive motor 523 (see FIG. 4) is provided at a lower end part of ball screw 522. A left-right pair of drive motors 523 each rotate ball screw 522 in the normal direction and in the reverse direction, whereby ball nuts 521 are moved upward and downward by the action of screw coupling, and lifting and lowering table 51 perform the lifting and lowering operation while maintaining the horizontal posture.

Pallet operation section 53 is disposed on the upper surface of lifting and lowering table 51. Pallet operation section 53 is a substantially rectangular parallelepiped-shaped portion having a width dimension in the left-right direction equivalent to that of magazine unit 2 and storage 4. Pallet operation section 53 includes a horizontal moving mechanism (no reference numeral) and moves in the left-right direction along guide rails 512 on the upper surface of lifting and lowering table 51. With this, pallet operation section 53 reciprocates between the rear side of magazine unit 2 and the rear side of storage 4.

Further, pallet operation section 53 has linear motion drive section 531 that drives pallet PT in the front-rear direction. The configuration of linear motion drive section 531 can be described as an example in which a guide rail that guides pallet PT in the front-rear direction, a gripping section that grips operation protrusions HT of pallet PT to hold pallet PT on the guide rail, and a drive source that drives the gripping section in the front-rear direction to move pallet PT along the guide rail are provided. In the first embodiment, pallet operation section 53 need only take out or put pallet PT from or into magazine unit 2 and storage 4 located on the front side, and does not require a function of taking out or putting in pallet PT from behind.

Magazine operation section 54 is disposed on the left side of a lower surface of lifting and lowering table 51. That is, magazine operation section 54 is located on the rear side of storage 4 and on the front side of unmanned conveyance vehicle 97 that has arrived. Magazine operation section 54 is a substantially rectangular parallelepiped-shaped portion having a width dimension in the left-right direction equivalent to that of magazine unit 2 and storage 4, and a height dimension larger than a height dimension of conveyance magazine 45.

Magazine operation section 54 has linear motion drive section 541 that drives conveyance magazine 45 in the front-rear direction. The configuration of linear motion drive section 541 can be described as an example in which internal space 542 capable of accommodating conveyance magazine 45, multiple roller members 543 that are provided on the lower side of internal space 542 and that are rotatable, and a drive source (not shown) are provided. The drive source rotationally drives at least one roller member 543 to take out or put conveyance magazine 45 from or into internal space 542. Magazine operation section 54 unloads conveyance magazine 45 from unmanned conveyance vehicle 97, which has arrived at the rear side of component supply device 1, to carry conveyance magazine 45 into the device or, conversely, carries out and loads conveyance magazine 45. Further, magazine operation section 54 takes out or puts conveyance magazine 45 from or into magazine storage shelves (42, 43) of storage 4 located on the front side. In a case where unmanned conveyance vehicle 97 and magazine storage shelves (42, 43) are provided with the same configuration as that of linear motion drive section 541 or the same members as multiple roller members 543, the movement of conveyance magazine 45 can be smoothed.

Exterior case 7 is formed in a housing shape by using a metal plate material. Exterior case 7 covers magazine unit 2, storage 4, and replacement mechanism 5. Angle member 71 entering a lower side of component mounter 91 is provided at a front lower part of exterior case 7 and extends horizontally forward. In addition, exterior case 7 has multiple wheels 72 on the lower sides of a case main body and of the angle member 71 to facilitate the movement. The width dimension of exterior case 7 is smaller than the width dimension of component mounter 91. Component supply device 1 is disposed so as to fall within a range of the width dimension of component mounter 91 in the board conveyance direction. With this, even in a case where a work such as opening and closing a cover of another board work machine has occurred when component mounter 91 and the other board work machine are disposed side by side, component supply device 1 does not interfere with the other board work machine.

An opening portion (not shown) through which pallet PT can be pulled out by pallet pulling-out mechanism 3 is provided in the vicinity of an intermediate height of a front surface of exterior case 7. As shown in FIG. 2, lower insertion door 75 is provided at a position immediately behind storage 4 in the vicinity of an intermediate height of a rear surface of exterior case 7. Lower insertion door 75 is opened by sliding downward, and is closed by sliding upward. Lower insertion door 75 is constantly closed to secure safety while preventing dust from entering therethrough. After the arrival of unmanned conveyance vehicle 97, lower insertion door 75 is opened in order to move conveyance magazine 45 between unmanned conveyance vehicle 97 and component supply device 1. The opening and closing operations of lower insertion door 75 are controlled by control section 6.

In the first embodiment, pallet PT is normally carried into component supply device 1 by using conveyance magazine 45 and unmanned conveyance vehicle 97. Nevertheless, there can often be a need for the operator to insert single pallet PT into the device. As a countermeasure for this, upper insertion door 76 is provided at a height position of exterior case 7 suitable for an insertion work of the operator. Specifically, upper insertion door 76 is disposed at a position immediately above lower insertion door 75 on the rear surface of exterior case 7. Upper insertion door 76 is constantly closed to secure safety while preventing dust from entering therethrough.

Upper insertion door 76 is a one-sided opening door of which a left edge is rotatably supported by a hinge. Upper insertion door 76 has a lock mechanism (not shown) that restricts the opening operation of the operator. The lock mechanism releases a locked state and allows the opening operation when conveyance magazine 45 is raised to a position immediately behind upper insertion door 76 by replacement mechanism 5. Therefore, upper insertion door 76 allows the operator to insert pallet PT into conveyance magazine 45, and restricts the operator to insert pallet PT into storage 4.

As described above, since a configuration has been employed in which the operator inserts pallet PT from upper insertion door 76 into conveyance magazine 45, the RFID tag can be read by using RFID reader 46 also for pallet PT inserted as a single pallet. Although the efficiency is slightly reduced, the operator may be allowed to insert pallet PT into conveyance magazine 45 from lower insertion door 75. In this aspect, upper insertion door 76 can be omitted.

2. Configuration Related to Control of Component Supply Device 1

Figure 6:
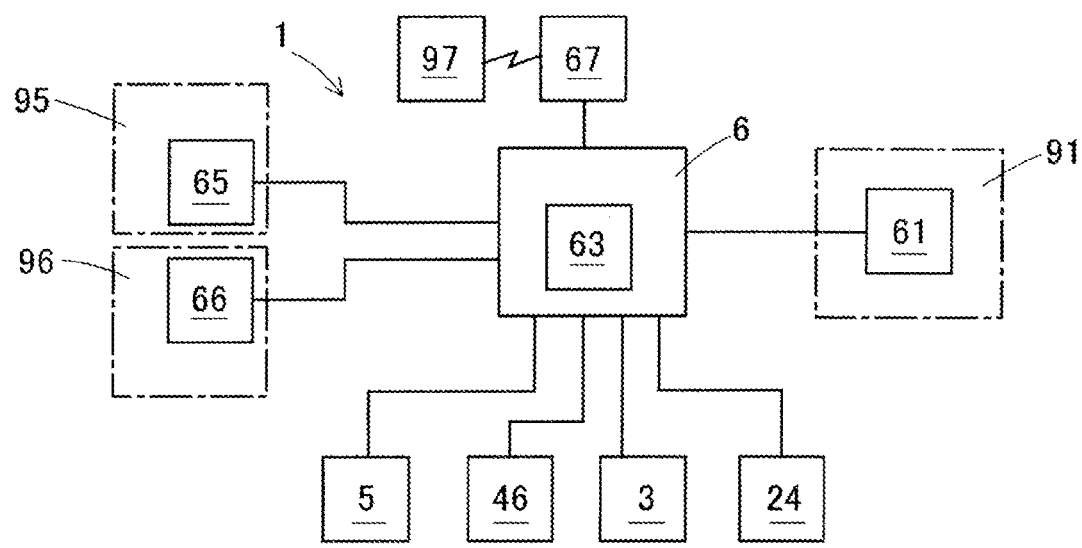
FIG. 6 is a block diagram showing a configuration related to control of the component supply device.

Next, a configuration related to control of component supply device 1 will be described with reference to FIG. 6. Control section 6 that controls the operation of component supply device 1 is configured using a computer device, and includes an input section, a display section, a communication interface section, and the like (not shown). As shown in FIG. 6, control section 6 is communicably connected to mounting control section 61 of component mounter 91. In addition, control section 6 is communicably connected to setup control section 65 that is disposed in external setup area 95 and that manages the setup work, and storage control section 66 that is disposed in component warehouse 96 and that manages the storage status of the members. Further, control section 6 is communicably connected to conveyance control section 67 that performs wireless control of unmanned conveyance vehicle 97. Various types of information are bidirectionally transmitted by these communication connections.

Control section 6 controls magazine lifting and lowering mechanism 24 and pallet pulling-out mechanism 3 by cooperative control with mounting control section 61. With this, the component supply work of component supply device 1 and the component mounting work of component mounter 91 are smoothly advanced. In addition, in a case of exchanging pallet PT in magazine (21, 22) in accordance with a command from mounting control section 61, control section 6 controls replacement mechanism 5 to replace pallet PT between magazine (21, 22) and storage 4.

Further, control section 6 requests at least one of setup control section 65 and storage control section 66 to replenish pallets PT when the number of pallets PT scheduled to be used, which are stored in storage 4, decreases and the number of used pallets PT increases. When the operator sets up conveyance magazine 45 and puts setup conveyance magazine 45 on unmanned conveyance vehicle 97 in response to the request, conveyance control section 67 controls the traveling of unmanned conveyance vehicle 97 to convey setup conveyance magazine 45 to component supply device 1. Conveyance control section 67 notifies control section 6 that unmanned conveyance vehicle 97 has arrived at component supply device 1.

Control section 6 that has received the notification performs control to unload conveyance magazine 45 from unmanned conveyance vehicle 97 and to store conveyance magazine 45 in upper magazine storage shelf 42 (carry-in shelf). RFID reader 46 operates on conveyance magazine 45 stored in upper magazine storage shelf 42. With this, the pallet numbers and the slot positions in conveyance magazine 45 are associated with each other for multiple pallets PT in conveyance magazine 45. The associated information is transmitted to control section 6.

Here, control section 6 executes the function of information management section 63. Specifically, when the operator sets up conveyance magazine 45 in external setup area 95, the operator creates, in setup control section 65, association information in which information regarding at least one item of a type, a remaining number, a disposition, and an order of use of the components held by pallet PT and the pallet number specifying the pallet are associated with each other. This association information is shared by setup control section 65, storage control section 66, and information management section 63. Therefore, information management section 63 can recognize the slot position, the pallet number, and the association information for each pallet PT in conveyance magazine 45 stored in upper magazine storage shelf 42, based on the reading result of RFID reader 46.

As a result, information management section 63 can continuously manage the progressions of the subsequent movement or use of pallet PT. Then, information management section 63 sequentially updates the association information in a case where a part of the information is changed. The sequential update of the association information is also performed and shared by mounting control section 61, setup control section 65, and storage control section 66. Accordingly, it is possible to accurately manage the movement status and the use status of pallet PT throughout the factory.

3. Operation of Component Supply Device 1

Figure 7:
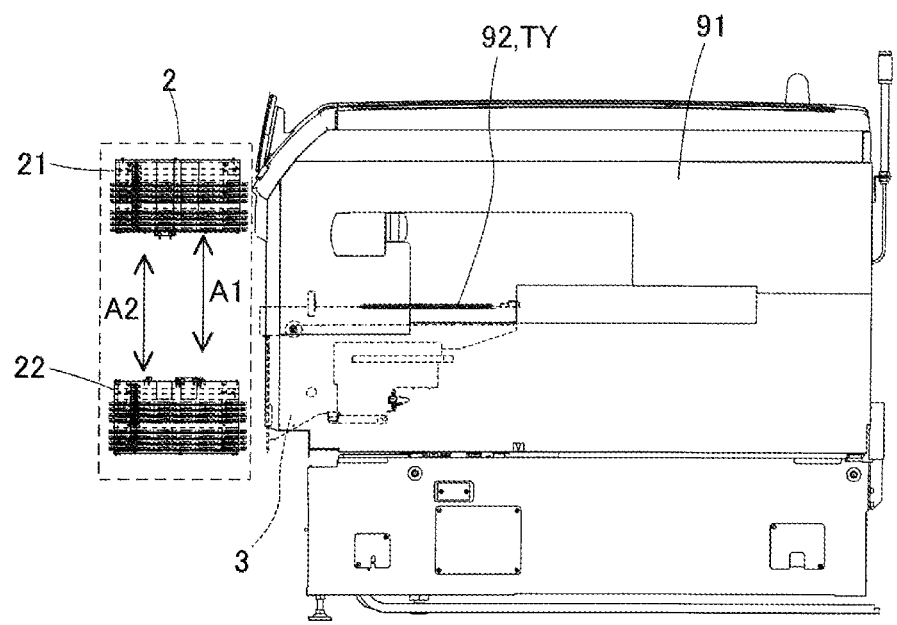
FIG. 7 is a diagram illustrating a component supply work of the component supply device.

The operation of component supply device 1 will be described. It is assumed that a sufficient number of pallets PT are stored in storage 4 at a time in point before the operation start of component supply device 1. The operations to be described below are executed by the control of control section 6. First, the component supply work performed by component supply device 1 will be described with reference to FIG. 7. As shown in FIG. 7, in the component supply work, two magazines (21, 22) are alternately placed in use and on standby.

Specifically, in FIG. 7, upper magazine 21 is located at an upper end position, and lower magazine 22 is located at a lower end position. Upper magazine 21 is lifted and lowered by magazine lifting and lowering mechanism 24 as indicated by arrow A1 when set to be in use, whereby the height of pallet PT, which is the pulling-out operation target, is aligned with the pulling-out height of pallet pulling-out mechanism 3. Next, pallet pulling-out mechanism 3 pulls out pallet PT to the component supply position to supply component PA, and returns pallet PT to upper magazine 21 after the component mounting tool picks up component PA.

Next, another pallet PT is selected by lifting and lowering upper magazine 21, and pallet pulling-out mechanism 3 operates again to supply component PA of the other pallet PT. While upper magazine 21 is set to be in use, lower magazine 22 is set to be on standby, and stops and stands by at the lower end position. Conversely, when upper magazine 21 is set to be on standby and lower magazine 22 is set to be in use, upper magazine 21 stops and stands by at the upper end position. On the other hand, lower magazine 22 is lifted and lowered by magazine lifting and lowering mechanism 24 as indicated by arrow A2, and pallet PT is pulled out and returned.

When component mounter 91 performs a component mounting work corresponding to multi-type and small-quantity production, magazine (21, 22) is assigned for each type of boards. Upper magazine 21 in use indicated by arrow A1 accommodates pallet PT corresponding to a first type of board being currently produced by component mounter 91. Meanwhile, lower magazine 22 on standby is caused to accommodate pallet PT corresponding to a second type (another type) of board to be produced next by component mounter 91 while standing by. When the component mounting work onto the first type of board ends, upper magazine 21 is changed and set to be on standby, and lower magazine 22 is changed and set to be in use.

Here, it is necessary to replace at least a part of pallet PT accommodated in upper magazine 21, which has just been put on standby, with another pallet PT corresponding to a third type of board to be produced next to the second type of board. Meanwhile, lower magazine 22 is in use and supplies component PA corresponding to the second type of board. When the component mounting work onto the second type of board ends, it is necessary to replace at least a part of pallet PT accommodated in lower magazine 22, which has just been put on standby, with another pallet PT corresponding to a fourth type of board.

Meanwhile, when component mounter 91 performs a component mounting work corresponding to single-type and large-quantity production, two magazines (21, 22) accommodate pallets PT holding the same type of components PA, but points are the same in that magazines (21, 22) are alternately placed in use and on standby. When the consumption of components PA proceeds in a first of magazines (21, 22), which is in use, and the component shortage occurs, the first of magazines (21, 22) is changed and set to be on standby, and a second of magazines (22, 21), which has been on standby until then, is changed and set to be in use. Then, in magazine (21, 22), which has just been put on standby, it is necessary to replace pallet PT. That is, in either the case of the multi-type and small-quantity production or the case of the single-type and large-quantity production, it is necessary to replace pallet PT with respect to magazine (21, 22) on standby.

As described above, two magazines (21, 22) are alternately placed in use and on standby, so that it is possible to shorten the production interruption time when the type of the board is changed or when component shortage has occurred. Accordingly, it is possible to maintain a high operating ratio of component mounter 91. In addition, in a configuration in which magazine unit 2 has one magazine, the magazine is inevitably put on standby at a time in point when component shortage has occurred, and it is necessary to replace pallet PT.

Next, a case where the replacement work of pallet PT is performed by replacement mechanism 5 on upper magazine 21 that is on standby at the upper end position after the end of the component mounting work onto the first type of board will be described as an example. Pallet PT taken out from upper magazine 21 is used pallet PT. Used pallet PT means pallet PT in which components PA have been used up in the component mounting work onto the first type of board, or pallet PT that is not scheduled to be used for the third type of board even in a case where pallet PT has been used for the first type of board. In addition, pallet PT to be put into upper magazine 21 is pallet PT scheduled to be used for the third type of board.

At the beginning of the replacement work, lifting and lowering drive mechanism 52 causes lifting and lowering table 51 to perform the lifting and lowering operation to align the height of pallet operation section 53 with the height of first used pallet PT to be pulled out first. Next, pallet operation section 53 moves horizontally to the rear side of upper magazine 21 to face first pallet PT. The lifting and lowering operation of lifting and lowering table 51 and the horizontal movement of pallet operation section 53 may be performed in parallel in time. Next, linear motion drive section 531 of pallet operation section 53 takes out first pallet PT from upper magazine 21 and holds first pallet PT. Next, lifting and lowering table 51 performs the lifting and lowering operation, and pallet operation section 53 moves horizontally to face empty pallet storage shelf 41 of storage 4. Next, linear motion drive section 531 puts first pallet PT into pallet storage shelf 41.

Next, lifting and lowering table 51 performs the lifting and lowering operation, and pallet operation section 53 faces second pallet PT which is scheduled to be used in storage 4. Next, linear motion drive section 531 takes out and holds second pallet PT. Next, lifting and lowering table 51 performs lifting and lowering operation, and pallet operation section 53 moves horizontally to face the position where first pallet PT of upper magazine 21 has been located. Next, linear motion drive section 531 puts second pallet PT into the position where the first pallet PT has been located. As a result, a unit replacement work of replacing one pallet PT ends.

Replacement mechanism 5 performs the replacement work for all pallets PT required for upper magazine 21 by repeating the unit replacement work multiple times. Thereafter, when the component mounting work onto the second type of board ends, replacement mechanism 5 performs the replacement work of pallet PT for lower magazine 22 that is on standby at the lower end position. Since the work procedure and the operation contents of the replacement work for lower magazine 22 do not differ from the replacement work for upper magazine 21 except that the height positions of magazines (21, 22) are different from each other, descriptions thereof will be omitted. When the replacement works for upper magazine 21 and lower magazine 22 are alternately repeated, the number of pallets PT scheduled to be used, which are stored in storage 4, decreases, and replenishment is required.

Next, a replenishment work of pallet PT performed by unmanned conveyance vehicle 97 and replacement mechanism 5 will be described. As described above, control section 6 requests the replenishment of pallet PT as necessary. Conveyance magazine 45 setup in response to the request is conveyed to component supply device 1 by unmanned conveyance vehicle 97. It is needless to say that multiple pallets PT scheduled to be used are accommodated in conveyance magazine 45. When unmanned conveyance vehicle 97 arrives at component supply device 1, control section 6 causes lower insertion door 75 to be opened.

Thereafter, replacement mechanism 5 performs the replenishment work of pallet PT. First, lifting and lowering drive mechanism 52 causes lifting and lowering table 51 to perform the lifting and lowering operation to align the height of magazine operation section 54 with the height of conveyance magazine 45 loaded on unmanned conveyance vehicle 97. Next, linear motion drive section 541 of magazine operation section 54 unloads conveyance magazine 45 from unmanned conveyance vehicle 97 and accommodates conveyance magazine 45 in internal space 542. Next, lifting and lowering table 51 performs the lifting and lowering operation to align the height of magazine operation section 54 with upper magazine storage shelf 42 (carry-in shelf). In a configuration in which the height of the loading platform of unmanned conveyance vehicle 97 coincides with the height of upper magazine storage shelf 42, the lifting and lowering operation of lifting and lowering table 51 is not necessary. Next, linear motion drive section 541 stores conveyance magazine 45 in upper magazine storage shelf 42.

Figure 8:
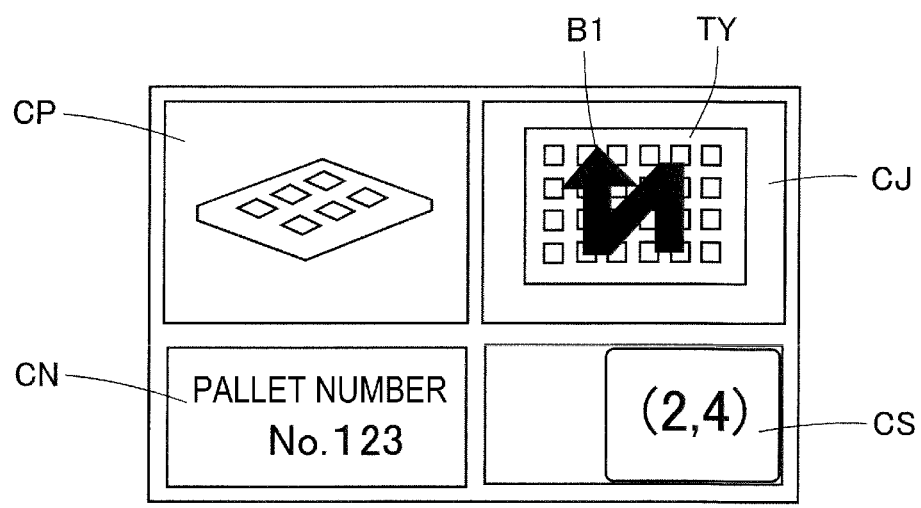
FIG. 8 is a diagram showing an example of a display screen on which an information management section displays association information.

Here, RFID reader 46 operates. With this, information management section 63 stores the association information including the pallet number, and the slot position in conveyance magazine 45 in combination with each other for each pallet PT in conveyance magazine 45. Information management section 63 displays the association information on the display section of control section 6 in response to a request from the operator or the like. The display format of a display screen shown in the example of FIG. 8 includes pallet number field CN at the lower left, component information field CP at the upper left, use order field CJ at the upper right, and use start position field CS at the lower right.

Pallet number field CN is a field for displaying a pallet number, in which "No. 123" is displayed as a display example. Component information field CP shifts to another detailed information display screen by a selection operation (click operation or the like) through the input section of control section 6. On the detailed information display screen, detailed information regarding component PA held by pallet PT, specifically, the type of the component, the manufacturer, the lot number, the procurement time, the shape, the electrical characteristics, and the like are displayed. Use order field CJ is a field for displaying the order of use of multiple components PA held in tray TY. In the display example, arrow B1 with a thick line bent is displayed by overlapping an image of tray TY.

Figure 9:
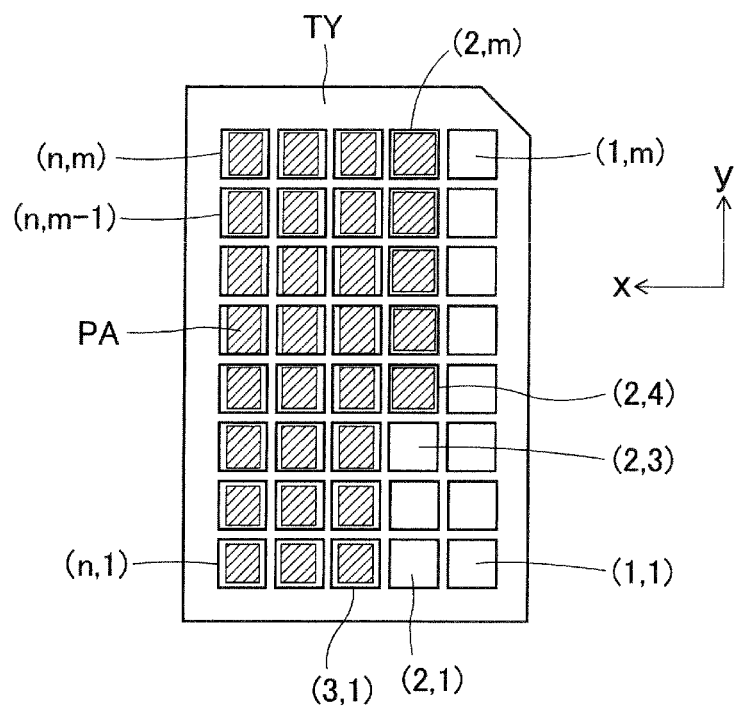
FIG. 9 is a plan view of an example of a tray attached to a pallet.

The meaning of arrow B1 will be described with reference to FIG. 9. In tray TY attached to pallet PT, multiple holding compartments are represented using a local (x, y) coordinate system. In FIG. 9, a lower right holding compartment is represented by (1, 1), an upper right holding compartment is represented by (1, m), a lower left holding compartment is represented by (n, 1), and an upper left holding compartment is represented by (n, m). The order of use represented by arrow B1 represents that the operation proceeds in order from (1, 1), (1, 2), (1, 3), . . . , to (1, m), and then moves to (2, 1) and moves from (2, m) to (3, 1), and finally proceeds from (n, m−1) to (n, m) to end. The order of use of components PA may also be displayed in a display form other than arrow B1, for example, in a form in which arrow B1 is rotated by 90°.

Use start position field CS displays (2, 4) as a display example, which represents that a component is first picked up from the holding compartment of (2, 4) shown in FIG. 9. That is, it is represented that components PA (indicated by hatching with dashed lines) are not already present because components PA have been picked up from the holding compartment of (1, 1) to the holding compartment of (2, 3), and that components PA are held from the holding compartment of (2, 4) to the holding compartment of (n, m). In the subsequent movements and uses of pallet PT, the association information described as an example is referenced, and the association information is sequentially updated.

Replacement mechanism 5 performs the replacement work of pallet PT after storing conveyance magazine 45 in upper magazine storage shelf 42 (carry-in shelf). Specifically, pallet operation section 53 takes out pallet PT scheduled to be used from conveyance magazine 45 and holds pallet PT scheduled to be used, is raised by being driven by lifting and lowering drive mechanism 52, and stores held pallet PT in empty pallet storage shelf 41. In addition, pallet operation section 53 takes out used pallet PT from pallet storage shelf 41 and holds used pallet PT, is lowered by being driven by lifting and lowering drive mechanism 52, and puts held pallet PT into conveyance magazine 45. Replacement mechanism 5 is also allowed to replace pallet PT between conveyance magazine 45 and magazine (21, 22).

When the replacement work ends, all of pallets PT scheduled to be used in conveyance magazine 45 are put into pallet storage shelves 41 and stored. Conveyance magazine 45 is in a state in which only used pallets PT are accommodated. Then, magazine operation section 54 moves, to lower magazine storage shelf 43 (carry-out shelf), conveyance magazine 45 in which pallets PT have been replaced in a state in which conveyance magazine 45 is stored in upper magazine storage shelf 42. As a result, upper magazine storage shelf 42 is emptied and ready to store another conveyance magazine 45.

When unmanned conveyance vehicle 97 on which another conveyance magazine 45 is loaded arrives at component supply device 1, magazine operation section 54 receives the other conveyance magazine 45 from unmanned conveyance vehicle 97 and stores the other conveyance magazine 45 in upper magazine storage shelf 42. In addition, magazine operation section 54 carries out first conveyance magazine 45 stored in lower magazine storage shelf 43 and loads conveyance magazine 45 on unmanned conveyance vehicle 97. As a result, first conveyance magazine 45 in which only used pallets PT are accommodated is conveyed to external setup area 95 for the next setup, or is conveyed to component warehouse 96 for storage.

With component supply device 1 of the first embodiment, in a case of exchanging pallet PT provided in the magazine (21, 22), replacement mechanism 5 replaces pallet PT between the magazine (21, 22) and storage 4. Here, storage 4 can store a larger number of pallets PT than magazine unit 2, and the setup replacement work of pallets PT is not necessary before all of stored pallets PT are used. Therefore, the replenishment work of pallet PT is performed at an appropriate time using conveyance magazine 45, so that it is possible to maintain a high operating ratio of component mounter 91 without causing a replenishment delay of pallet PT.

Further, since a configuration has been employed in which magazine storage shelves (42, 43) that store conveyance magazines 45 are provided in storage 4 and unmanned conveyance vehicle 97 conveys conveyance magazine 45, the replenishment work of pallet PT is automatically performed. With this, the operator need only perform the setup work in external setup area 95, and it is not necessary to move to component supply device 1. Accordingly, the burden on the operator is further reduced as compared with the conventional art.

The configuration of the first embodiment can be simplified. Component supply device 1 of the simplified minimum embodiment includes magazine unit 2 in which lower magazine 22 is omitted, pallet pulling-out mechanism 3, storage 4 in which magazine storage shelves (42, 43) are omitted, and replacement mechanism 5 in which magazine operation section 54 is omitted. In the minimum embodiment, conveyance magazine 45, unmanned conveyance vehicle 97, RFID reader 46, and other types of tag readers, and information management section 63 are not used.

Therefore, the operator performs the setup replacement work of replacing pallet PT in storage 4 with another pallet PT. Here, storage 4 can store a larger number of pallets PT than magazine unit 2, and the setup replacement work of pallets PT is not necessary before all of stored pallets PT are used. Accordingly, the setup replacement work in the minimum embodiment is performed less frequently as compared with the conventional setup replacement work of exchanging magazine (21, 22). That is, the operator can perform the setup replacement work of exchanging a larger number of pallets PT at a time than in the conventional art at a lower frequency than in the conventional art. As a result, the burden on the operator is further reduced as compared with the conventional art.

4. Component Supply Device 1A of Second Embodiment

Figure 10:
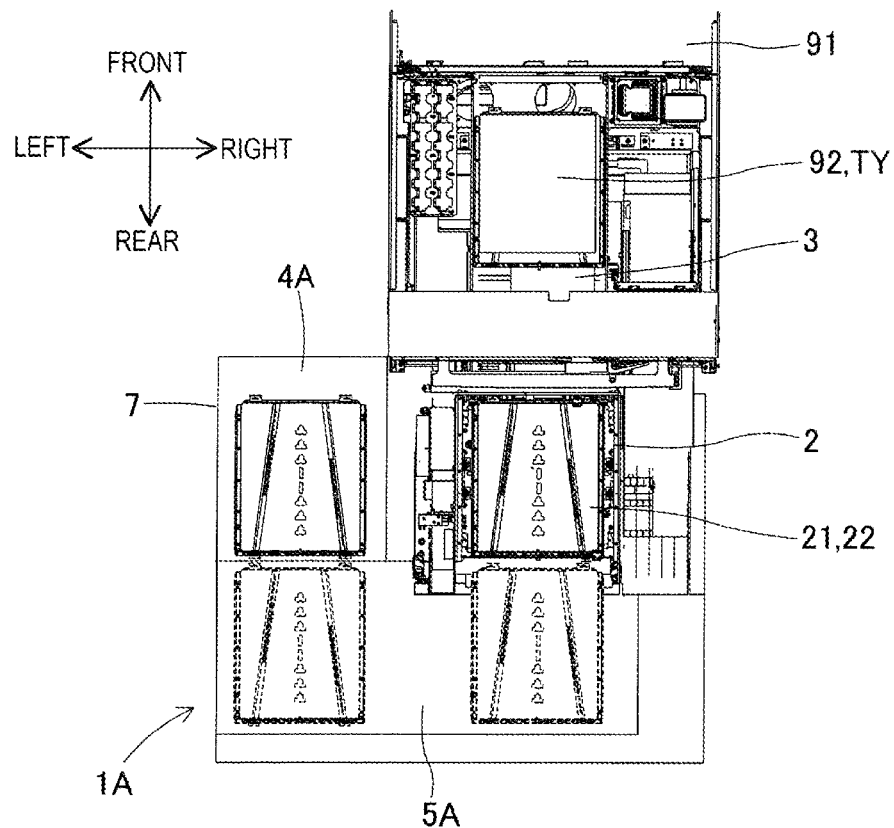
FIG. 10 is a plan view of a component supply device of a second embodiment.

Next, component supply device 1A of the second embodiment will be described with reference to FIG. 10 mainly on points different from the first embodiment. In the second embodiment, storage 4A is disposed on the left side of magazine unit 2 in the same manner as in the first embodiment. However, in a case of enlarging the width of pallet PT, for example, for the purpose of using larger tray TY than in the first embodiment or arranging and mounting multiple trays TY on pallet PT, storage 4A is disposed to protrude leftward with respect to a left-side surface of component mounter 91. With this, replacement mechanism 5A and exterior case 7 protrude leftward with respect to the left-side surface of component mounter 91. Storage 4A is not limited to the left side of magazine unit 2, and may be disposed on the right side of magazine unit 2. In a case where magazine unit 2 is disposed on the right side, magazine operation section 54 is provided on the right side of replacement mechanism 5A.

In the second embodiment, the operations, the actions, and the effects of component supply device 1A are the same as those of the first embodiment. However, when component mounter 91 and another board work machine are disposed side by side so as to be in contact with each other, component supply device 1A may interfere with the other board work machine. As a countermeasure for this case, component mounter 91 and the other board work machine are disposed so as to be spaced apart from each other, and an intermediate conveyance device for conveying the board is provided between component mounter 91 and the other board work machine spaced apart from each other.

5. Component Supply Device 1B of Third Embodiment

Figure 11:
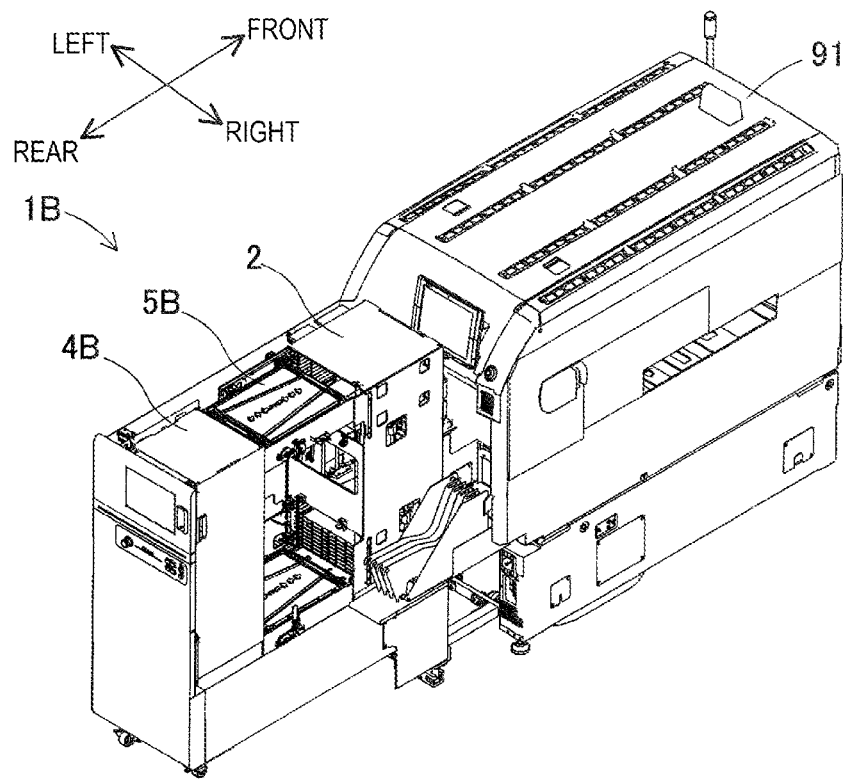
FIG. 11 is a perspective view of a component supply device of a third embodiment.

Next, component supply device 1B of the third embodiment will be described with reference to FIG. 11 mainly on points different from the first embodiment. In component supply device 1B of the third embodiment, magazine unit 2 is disposed on the rear side of component mounter 91, replacement mechanism 5B is disposed on the rear side of magazine unit 2, and storage 4B is disposed on the rear side of replacement mechanism 5B. That is, magazine unit 2, replacement mechanism 5B, and storage 4B are arranged in series in order in the direction opposite to the direction in which pallet pulling-out mechanism 3 pulls out pallet PT from magazine unit 2.

Storage 4B is open on the front side, and stores pallets PT such that pallet PT can be taken out or put in from the front thereof. In addition, pallet operation section 53 of replacement mechanism 5B differs from the first embodiment in that the horizontal moving mechanism is not provided. Further, pallet operation section 53 takes out or puts pallet PT from or into magazine (21, 22) provided on the front, and also takes out or puts pallet PT from or into storage 4B provided on the rear.

In addition, unmanned conveyance vehicle 97 arrives at a right-sided position or a left-sided position of replacement mechanism 5B. Therefore, magazine operation section 54 of replacement mechanism 5B includes a right-angle direction drive section instead of linear motion drive section 541. The right-angle direction drive section performs a carry-in operation of unloading conveyance magazine 45 from unmanned conveyance vehicle 97 located at the right side or at the left side to carry conveyance magazine 45 into the device, and of storing conveyance magazine 45 by aligning the direction of conveyance magazine 45 with upper magazine storage shelf 42 (carry-in shelf) of storage 4B while changing the movement direction of conveyance magazine 45 by 90°. In addition, the right-angle direction drive section performs a carry-out operation of conveyance magazine 45 from lower magazine storage shelf 43 (carry-out shelf) in a reverse route through a reverse direction operation. Conveyance magazine 45 is taken out or put in from the side of replacement mechanism 5B, so that it is not necessary to secure a space for unmanned conveyance vehicle 97 to work behind component supply device 1B.

Magazine operation section 54 of replacement mechanism 5B may be provided with linear motion drive section 541. In this case, unmanned conveyance vehicle 97 determines the mounting direction when conveying conveyance magazine 45 in advance in conformity with the direction of pallet PT in component supply device 1B. In addition, unmanned conveyance vehicle 97 may arrive behind storage 4B. In this case, magazine operation section 54 of replacement mechanism 5B is disposed separately from pallet operation section 53 and behind storage 4B. Conveyance magazine 45 is taken out or put in from behind storage 4B, so that it is not necessary to secure a space for unmanned conveyance vehicle 97 to work on the side of component supply device 1B.

In the third embodiment, the disposition of storage 4B and the movement directions of pallet PT and conveyance magazine 45 are different from those of the first embodiment, but the actions and the effects are the same as those of the first embodiment. In addition, component supply device 1B is disposed so as to fall within the range of the width dimension of component mounter 91. Nevertheless, in a case where component mounter 91 and another board work machine are disposed side by side so as to be in contact with each other, there is a probability of interfering with the other board work machine provided on an arrival side when unmanned conveyance vehicle 97 has arrived at the side of component supply device 1B. As a countermeasure for this case, an intermediate conveyance device may be provided in the same manner as in the second embodiment.

6. Component Supply Device 1C of Fourth Embodiment

Figure 12:
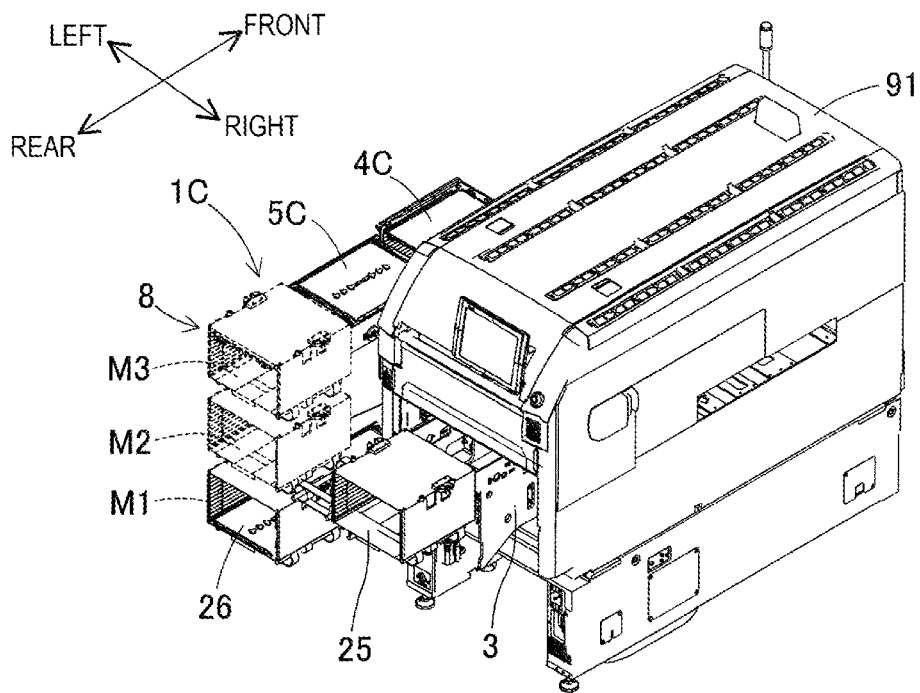
FIG. 12 is a perspective view of a component supply device of a fourth embodiment.
Figure 13:
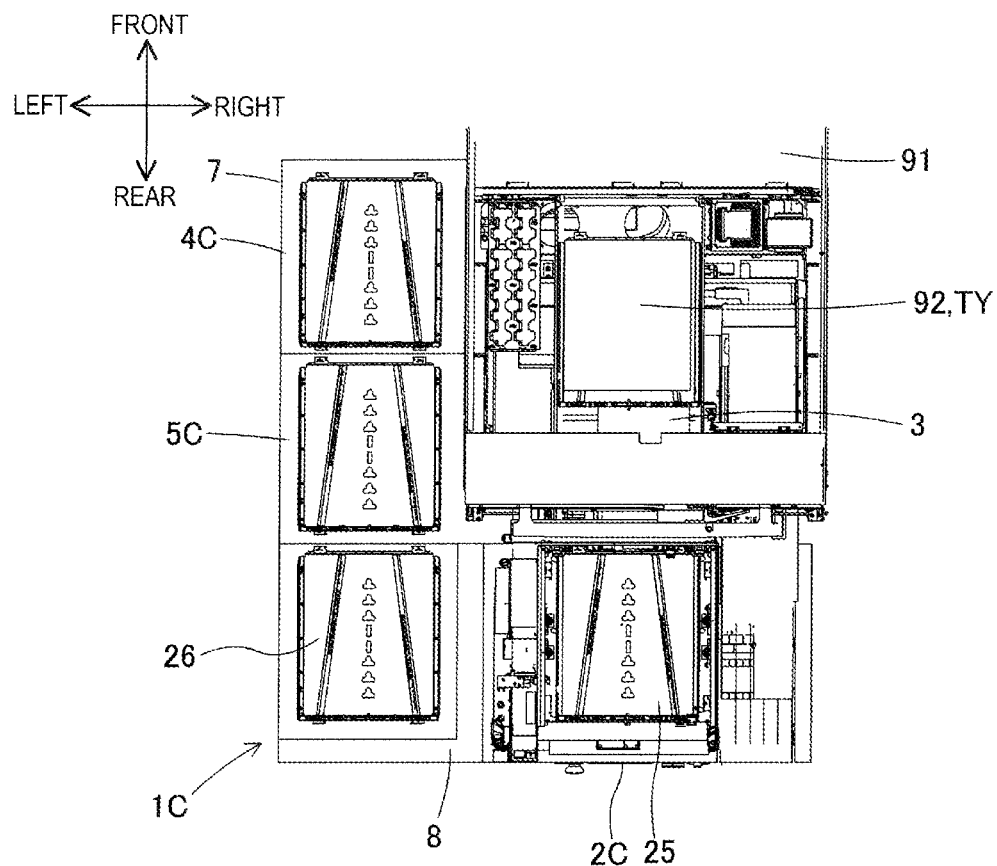
FIG. 13 is a plan view of the component supply device of the fourth embodiment.

Next, component supply device 1C of the fourth embodiment will be described with reference to FIGS. 12 and 13 mainly on points different from the first embodiment. In component supply device 1C of the fourth embodiment, magazine unit 2C is disposed on the rear side of component mounter 91. Further, storage 4C is disposed on the left side of component mounter 91, replacement mechanism 5C is disposed on the rear side of storage 4C, and magazine replacement mechanism 8 is disposed on the rear side of replacement mechanism 5C. Magazine replacement mechanism 8 is located on the left side of magazine unit 2C.

Unlike the first to third embodiments, magazine unit 2C is provided with one magazine 25 therein. However, magazine 25 is replaceable. Magazine lifting and lowering mechanism 24 of magazine unit 2C lifts and lowers first magazine 25 to align the height of pallet PT, which is the pulling-out operation target, with the pulling-out height of the pallet pulling-out mechanism 3.

Magazine replacement mechanism 8 replaces first magazine 25 provided in magazine unit 2C with second magazine 26 not provided in magazine unit 2C. Specifically, magazine replacement mechanism 8 has three positions for holding magazines (25, 26), that is, lower position M1, middle position M2, and upper position M3. In FIG. 12, second magazine 26 held at lower position M1 is indicated by solid lines. Magazine replacement mechanism 8 has a lifting and lowering moving mechanism that lifts and lowers magazines (25, 26) between lower position M1 and middle position M2, and between middle position M2 and upper position M3. Further, magazine replacement mechanism 8 has a horizontal moving mechanism that horizontally moves magazines (25, 26) between middle position M2 and magazine unit 2C.

As in the third embodiment, pallet operation section 53 of replacement mechanism 5C does not include the horizontal moving mechanism, and has a function of taking out or putting in pallet PT in both the front and rear directions. With this, replacement mechanism 5C can replace pallet PT between storage 4C provided on the front side and second magazine 26 held at lower position M1 provided on the rear side. Further, replacement mechanism 5C can replace pallet PT between storage 4C provided on the front side and magazine 25 moved to upper position M3 on the rear side.

Next, an operation of component supply device 1C of the fourth embodiment will be described. Magazine unit 2C advances the component supply work by lifting and lowering first magazine 25 in which pallets PT corresponding to the first type of board which is being produced are accommodated. During this time, replacement mechanism 5C puts pallet PT corresponding to the second type of board to be produced next into second magazine 26 held at lower position M1 for setup.

When the production of the first type of board ends, magazine replacement mechanism 8 operates. First, the horizontal moving mechanism of magazine replacement mechanism 8 moves first magazine 25 in magazine unit 2C to middle position M2, and then the lifting and lowering moving mechanism raises magazine 25 to upper position M3. Next, the lifting and lowering moving mechanism raises second magazine 26 of lower position M1 to middle position M2, and then the horizontal moving mechanism moves magazine 26 into magazine unit 2C. As a result, magazine unit 2C performs the component supply work by lifting and lowering magazine 26, and the production of the second type of board is advanced.

While the second type of board is produced, replacement mechanism 5C puts pallet PT corresponding to the third type of board to be produced next to the second type of board into magazine 25 held at upper position M3 for setup. When the production of the second type of board ends, magazine 26 in magazine unit 2C is returned to lower position M1, and magazine 25 in upper position M3 moves again into magazine unit 2C. As described above, for two magazines (25, 26), the use in magazine unit 2C and the setup in lower position M1 or in upper position M3 are alternately repeated.

With component supply device 1C of the fourth embodiment, replacement mechanism 5C can replace pallet PT between magazine (25, 26) and storage 4C. Here, storage 4C can store a larger number of pallets PT than magazines (25, 26), and the setup replacement work of pallets PT is not necessary before all of stored pallets PT are used. Therefore, in an aspect in which the replenishment work for conveying conveyance magazine 45 with unmanned conveyance vehicle 97 is combined, a replenishment delay of pallet PT does not occur, and a high operating ratio of component mounter 91 can be maintained. In addition, in an aspect in which the operator replenishes storage 4C with pallets PT without using unmanned conveyance vehicle 97 or conveyance magazine 45, the replenishment work is performed less frequently as compared with the conventional technique in which the operator exchanges magazine (25, 26). As a result, the burden on the operator is further reduced as compared with the conventional art.

7. Component Supply Device 1D of Fifth Embodiment

Next, component supply device 1D of the fifth embodiment will be described with reference to FIG. 14 mainly on points different from the first embodiment. Component supply device 1D of the fifth embodiment includes two supply units 31, and storage 4D and replacement mechanism 5D are shared by two supply units 31. Each of supply units 31 includes magazine unit 2 and pallet pulling-out mechanism 3 described above. Supply units 31 are individually provided in two component mounters 91 disposed side by side, respectively.

Figure 14:
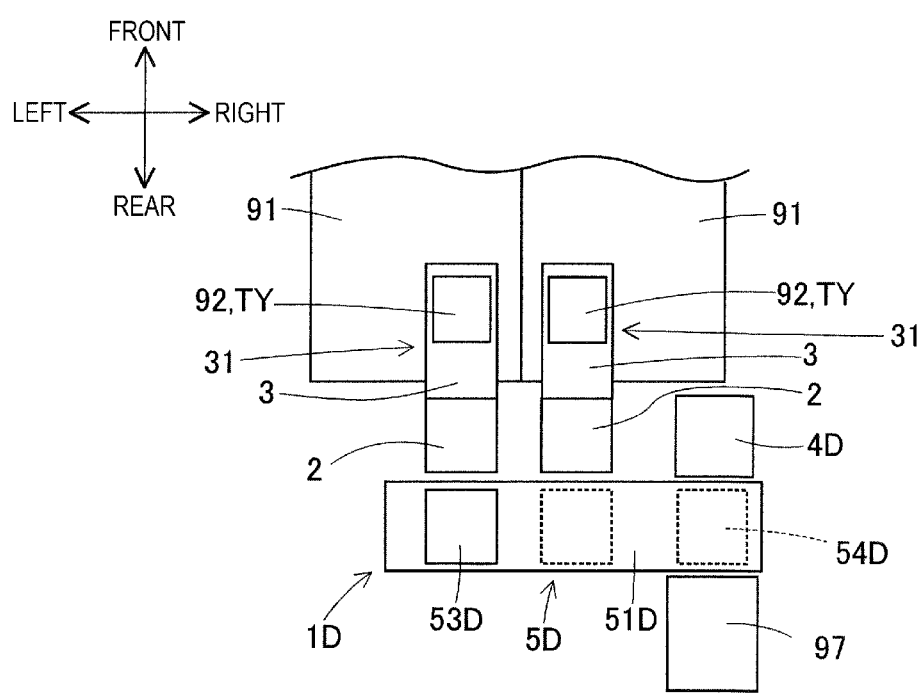
FIG. 14 is a plan view schematically showing a component supply device of a fifth embodiment.

As shown in FIG. 14, storage 4D is disposed on the right side of magazine unit 2 disposed on the rear side of right-side component mounter 91. In addition, lifting and lowering table 51D of replacement mechanism 5D is disposed so as to cross the rear sides of two magazine units 2 and of storage 4D. Pallet operation section 53D disposed on an upper surface of lifting and lowering table 51D horizontally moves to three positions indicated by solid lines and dashed lines to replace pallet PT between two magazine units 2 and storage 4D. Further, the arrival position of unmanned conveyance vehicle 97 is set immediately behind storage 4D, and magazine operation section 54D is disposed on a lower surface of lifting and lowering table 51D between the arrival position and storage 4D.

In the fifth embodiment, the operations and the actions related to the component supply work of component supply device 1D and the replacement or replenishment work of pallet PT are the same as those in the first embodiment, and descriptions thereof will be omitted. In the fifth embodiment, since storage 4D and replacement mechanism 5D are shared by two supply units 31, it is possible to reduce the device cost as compared with the case where component supply device 1 of the first embodiment is provided in each of two component mounters 91. In addition, it is possible to contribute to space saving. Storage 4D and replacement mechanism 5D may be shared by three or more supply units 31.

8. Component Supply Device 1E of Sixth Embodiment

Next, component supply device 1E of the sixth embodiment will be described with reference to FIG. 15 mainly on points different from the first embodiment. In component supply device 1E of the sixth embodiment, two sets of supply units 31 and storages 4 are individually provided in two component mounters 91 disposed side by side, respectively. Storage 4 provided for each component supply device 1E mainly stores pallets PT used for component mounter 91. Replacement mechanism 5E of component supply device 1E is shared by the two sets of supply units 31 and storages 4.

Figure 15:
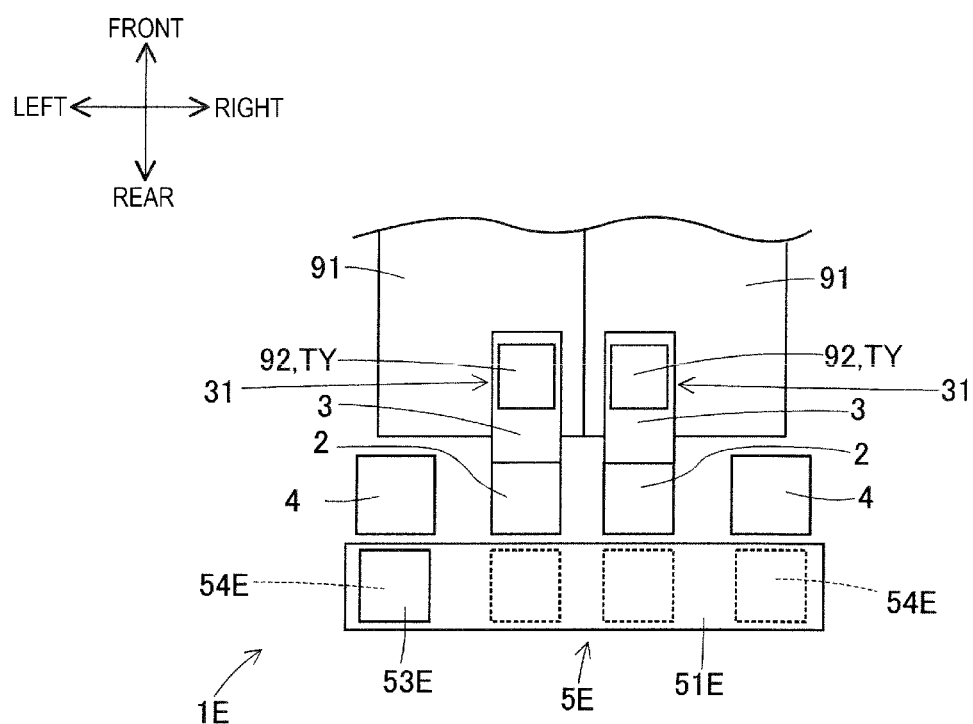
FIG. 15 is a plan view schematically showing a component supply device of a sixth embodiment.

In FIG. 15, two supply units 31 are disposed between two storages 4, but the disposition order thereof can be changed. Lifting and lowering table 51E of replacement mechanism 5E is disposed so as to cross the rear sides of two supply units 31 and of two storages 4. Pallet operation section 53E disposed on an upper surface of lifting and lowering table 51E horizontally moves to four positions indicated by solid lines and dashed lines, and replaces pallet PT between magazine unit 2 and storage 4 for each component mounter 91. In addition, component supply device 1E can mutually lend pallet PT between two storages 4.

Further, the arrival positions of unmanned conveyance vehicle 97 are set immediately behind two storages 4, and two magazine operation sections 54E are each disposed on a lower surface of lifting and lowering table 51E between the arrival position and storage 4. The arrival positions and magazine operation sections 54E may each be one. In the sixth embodiment, the operations, the actions, and the effects of component supply device 1E are the same as those of the fifth embodiment, and a description thereof will be omitted. Replacement mechanism 5E may be shared by three or more sets of supply units 31 and storages 4.

9. Applications and Modifications of Embodiments

A first application embodiment can be employed by adding lower magazine 22 to the minimum embodiment described in the first embodiment, and a second application embodiment in which two magazines (21, 22) are alternately placed in use and on standby can be employed. In addition, a third application embodiment in which magazine storage shelves (42, 43) and magazine operation section 54 are added to the minimum embodiment and the operator conveys conveyance magazine 45 to component supply device 1 can be employed. Further, a fourth application embodiment can be employed by adding unmanned conveyance vehicle 97 to the third application embodiment. In addition, a fifth application embodiment can be employed by adding RFID reader 46 or another type of tag reader to the minimum embodiment, and a sixth application embodiment can be employed by adding information management section 63.

In addition, a combination embodiment in which the first to sixth application embodiments described above are appropriately combined can be employed. In addition, the first to sixth application embodiments and the combination embodiment described above can be applied to component supply devices (1A to 1E) of the second to sixth embodiments. Further, in a case where a barcode is used as the identification tag of pallet PT, a barcode reader corresponding to the tag reader is provided on the inner surface of exterior case 7. The barcode reader can subsequently read the barcodes attached to each of multiple pallets PT accommodated in conveyance magazine 45 by replacement mechanism 5 lifting and lowering conveyance magazine 45. Various other applications and modifications can be made for the first to sixth embodiments.

REFERENCE SIGNS LIST 1, 1A, 1B, 1C, 1D, 1E: component supply device
2, 2C: magazine unit
21: upper magazine
22: lower magazine
25, 26: magazine
3: pallet pulling-out mechanism
31: supply unit
4, 4A, 4B, 4C, 4D: storage
41: pallet storage shelf
42: upper magazine storage shelf
43: lower magazine storage shelf
45: conveyance magazine
46: RFID reader
5, 5A, 5B, 5C, 5D, 5E: replacement mechanism
51, 51D, 51E: lifting and lowering table
52: lifting and lowering drive mechanism
53, 53D, 53E: pallet operation section
531: linear motion drive section
54, 54D, 54E: magazine operation section
541: linear motion drive section
6: control section
63: information management section
7: exterior case
75: lower insertion door
76: upper insertion door
91: component mounter
92: component supply position
95: external setup area
96: component warehouse
97: unmanned conveyance vehicle
PT: pallet
TY: tray
PA: component

The invention claimed is:
1. A component supply device comprising:
 a magazine unit provided with a magazine accommodating multiple pallets each of which holds multiple components;

a pallet pulling-out mechanism configured to selectively pull out the pallet from the magazine and transfer the pallet to a component supply position of a component mounter;
a storage configured to store a larger number of the multiple pallets than the magazine unit; and
a replacement mechanism configured to replace the pallet between the magazine and the storage, wherein
the magazine unit and the storage are disposed side by side in a board conveyance direction in which the component mounter conveys a board, and
the replacement mechanism is commonly disposed in the magazine unit and the storage such that the pallet can be pulled out from the magazine unit, in a direction opposite to a direction in which the pallet pulling-out mechanism pulls out the pallet from the magazine unit.

2. The component supply device according to claim 1, wherein the component supply device is disposed so as to fall within a width of the component mounter in the board conveyance direction.

3. A component supply device comprising:
a magazine unit provided with a magazine accommodating multiple pallets each of which holds multiple components;
a pallet pulling-out mechanism configured to selectively pull out the pallet from the magazine and transfer the pallet to a component supply position of a component mounter;
a storage configured to store a larger number of the multiple pallets than the magazine unit; and
a replacement mechanism configured to replace the pallet between the magazine and the storage,
wherein the magazine unit, the replacement mechanism, and the storage are arranged in series in order in a direction opposite to a direction in which the pallet pulling-out mechanism pulls out the pallet from the magazine unit.

4. A component supply device comprising:
a magazine unit replaceably provided with a magazine accommodating multiple pallets each of which holds multiple components;
a pallet pulling-out mechanism configured to selectively pull out the pallet from a first magazine, which is provided in the magazine unit, and transfer the pallet to a component supply position of a component mounter;
a storage configured to store a larger number of the multiple pallets than the magazine unit;
a replacement mechanism configured to replace the pallet between the storage and a second magazine, which is not provided in the magazine unit; and
a magazine replacement mechanism configured to replace the first magazine with the second magazine, wherein
the magazine unit and the storage are disposed side by side in a board conveyance direction in which the component mounter conveys a board, and
the replacement mechanism is commonly disposed in the magazine unit and the storage such that the pallet can be pulled out from the magazine unit, in a direction opposite to a direction in which the pallet pulling-out mechanism pulls out the pallet from the magazine unit.

5. The component supply device according to claim 1, wherein the magazine is configured to be lifted and lowered relative to the pallet pulling-out mechanism, and includes a magazine in use that is lifted and lowered and another magazine on standby that is not lifted and lowered, and the replacement mechanism takes out a pallet in which the components have been used up or a pallet that is not scheduled to be used from the magazine on standby and puts the pallet into the storage, and takes out a pallet that is scheduled to be used from the storage and puts the pallet into the magazine on standby.

6. The component supply device according to claim 1, further comprising:
a magazine storage shelf configured to store a conveyance magazine capable of accommodating and carrying the multiple pallets,
wherein the replacement mechanism replaces the pallet between the conveyance magazine stored in the magazine storage shelf and at least one of the storage and the magazine.

7. The component supply device according to claim 6, wherein the conveyance magazine differs from the magazine in at least one of an accommodation structure configured to accommodate the multiple pallets and the number of accommodations.

8. The component supply device according to claim 6, wherein the conveyance magazine is conveyed by an unmanned conveyance vehicle between the component supply device, and an external setup area provided outside the component supply device or a component warehouse capable of storing the components together with the pallet and the conveyance magazine.

9. The component supply device according to claim 6, wherein the replacement mechanism has a pallet operation section configured to take out or put the pallet from or into the magazine and the storage, and a magazine operation section configured to take out or put the conveyance magazine from or into the magazine storage shelf.

10. The component supply device according to claim 9, wherein the storage has multiple pallet storage shelves arranged in an up-down direction, and multiple magazine storage shelves arranged in the up-down direction, the multiple pallet storage shelves storing the multiple pallets, respectively,
the replacement mechanism has a lifting and lowering drive section configured to drive the pallet operation section and the magazine operation section in the up-down direction,
the pallet operation section has a linear motion drive section configured to drive the pallet in a front-rear direction, and
the magazine operation section has a linear motion drive section configured to drive the conveyance magazine in the front-rear direction.

11. The component supply device according to claim 9, wherein multiple magazine storage shelves are provided as the magazine storage shelf, and include a carry-in shelf that stores the conveyance magazine carried into the component supply device and a carry-out shelf that stores the conveyance magazine to be carried out from the component supply device,
the pallet operation section takes out a pallet that is scheduled to be used from the conveyance magazine stored in the carry-in shelf and puts the pallet into the storage or the magazine, and takes out a pallet in which the components have been used up or a pallet that is not scheduled to be used from the storage and puts the pallet into the conveyance magazine stored in the carry-in shelf, and
the magazine operation section moves, to the carry-out shelf, the conveyance magazine in which the pallets have been replaced in a state in which the conveyance magazine is stored in the carry-in shelf.

12. The component supply device according to claim 8, wherein multiple magazine storage shelves are provided as the magazine storage shelf, and include a carry-in shelf that stores the conveyance magazine carried into the component supply device and a carry-out shelf that stores the conveyance magazine to be carried out from the component supply device, and the replacement mechanism receives the conveyance magazine from the unmanned conveyance vehicle to carry the conveyance magazine into the carry-in shelf, and carries out the conveyance magazine stored in the carry-out shelf to the unmanned conveyance vehicle.

13. The component supply device according to claim 1, wherein the pallet is attached with an identification tag indicating a pallet number specifying the pallet, and the storage or the replacement mechanism has a tag reader configured to read the identification tag to recognize the pallet number.

14. The component supply device according to claim 13, further comprising:

an information management section configured to manage information regarding at least one item of a type, a remaining number, a disposition, and an order of use of the components held by the pallet, and the pallet number specifying the pallet in association with each other based on a reading result of the tag reader.

15. The component supply device according to claim 11, wherein the pallet incorporates an identification tag configured to transmit a pallet number specifying the pallet with a wireless signal, and the carry-in shelf has a tag reader configured to receive the wireless signal transmitted from the identification tag of the pallet accommodated in the conveyance magazine to recognize the pallet number and configured to allow association with an accommodation position in the conveyance magazine.

16. The component supply device according to claim 1, further comprising:

an exterior case configured to cover the storage and the replacement mechanism and including an insertion door that allows an operator to insert the pallet.

17. The component supply device according to claim 15, further comprising:

an exterior case configured to cover the storage and the replacement mechanism and including an insertion door that allows an operator to insert the pallet into the conveyance magazine and that restricts the operator to insert the pallet into the storage.

18. The component supply device according to claim 1, further comprising:

multiple supply units each of which includes the magazine unit and the pallet pulling-out mechanism, wherein at least one of the storage and the replacement mechanism is shared by the multiple supply units.

* * * * *